United States Patent [19]

Regan

[11] 4,185,250
[45] Jan. 22, 1980

[54] VOICE FREQUENCY RC ACTIVE FILTER

[75] Inventor: John F. Regan, Lombard, Ill.

[73] Assignee: Wescom Switching, Inc., Oak Brook, Ill.

[21] Appl. No.: 902,281

[22] Filed: May 3, 1978

[51] Int. Cl.² ............................................. H03F 3/181
[52] U.S. Cl. .................................. 330/107; 330/109; 333/213; 333/217
[58] Field of Search ........................ 330/107, 109, 303; 333/80 T, 80 R

[56] References Cited

U.S. PATENT DOCUMENTS 2,983,875 5/1961 Zechter ................................ 330/303

FOREIGN PATENT DOCUMENTS 1413722 11/1975 United Kingdom ................ 330/109 X

*Primary Examiner*—James B. Mullins
*Attorney, Agent, or Firm*—Leydig, Voit, Osann, Mayer & Holt, Ltd.

[57] ABSTRACT

A voice-frequency RC-active filter comprising a plurality of resistors and generalized impedance converter networks for synthesizing the frequency response of a preselected LC filter. Each generalized impedance converter network includes a pair of operational amplifiers and a plurality of impedances Z1, Z2, Z3, Z4 and Z5 interconnected with the amplifiers to provide the network with a driving point impedance $$Zi = \frac{Z1\ Z3\ Z5}{Z2\ Z4}$$

in which at least one of the impedances in both the numerator and the denominator of Zi includes a film-type resistor. At least one of the film-type resistors included in the impedances Z1, Z2, Z3, Z4 and Z5 is functionally trimmed to tune the filter. The capacitors in the filter are preferably discrete polycarbonate capacitors with a capacitance tolerance of ±5%, and all having the same value.

9 Claims, 2 Drawing Figures

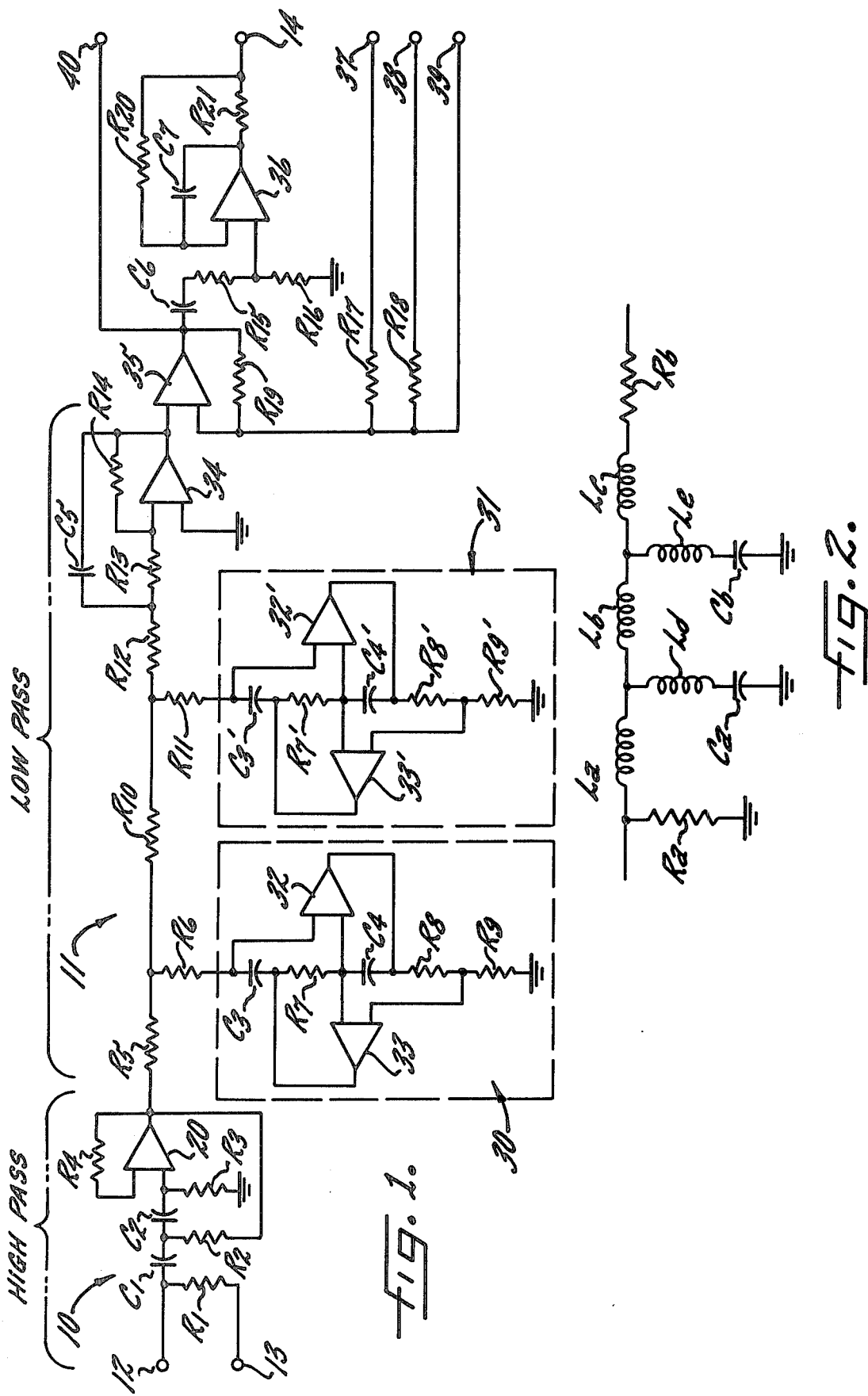

VOICE FREQUENCY RC ACTIVE FILTER

DESCRIPTION OF THE INVENTION

The present invention relates generally to electrical filters and, more particularly, to active electrical filters utilizing generalized impedance converter networks to synthesize the frequency response of passive LC filters.

It is a primary object of this invention to provide an improved RC-active filter that can be economically manufactured at high production rates while meeting stringent performance specifications, including low passband ripple specifications.

It is another object of this invention to provide an improved active filter of the foregoing type that can be quickly and efficiently tuned in mass production with a high yield of filters that satisfy stringent performance specifications.

A further object of this invention is to provide such an improved active filter that eliminates the need for trimming of the capacitors therein during manufacture.

Other objects and advantages of the invention will be apparent from the following detailed description and the accompanying drawings, in which:

FIG. 1 is a circuit diagram of an RC-active filter embodying the invention and designed for use in a transmitting line in a telephone switching system; and FIG. 2 is a circuit diagram of an LCR filter whose frequency response is simulated by the RC-active filter of FIG. 1.

While the invention will be described in connection with certain preferred embodiments, it will be understood that it is not intended to limit the invention to these particular embodiments. On the contrary, it is intended to cover all alternatives, modifications and equivalent arrangements as may be included within the spirit and scope of the invention as defined in the appended claims.

Turning now to the drawings and referring first to FIG. 1, there is shown a voice-frequency RC-active filter designed for use in a transmitting line of a telephone system. The filter comprises a high-pass section 10 and a low-pass section 11 with the combination of the two sections forming a band-limiting filter with a flat response within a prescribed band of frequencies (e.g., between 300 and 3000 Hz. with less than ±0.1-dB ripple, and 1.5 dB points at 180 and 3400 Hz.) and a prescribed rolloff (e.g., 12 dB) at the lower end of the pass band. This type of filter normally receives a voice-frequency analog signal from a hybrid transformer connected across lines 12 and 13 and transmits an amplified and reshaped signal to a multiplexer (not shown) via output line 14.

The high-pass filter section 10 is a conventional Sallen and Key second-order high-pass filter which includes an operational amplifier 20 connected as a voltage follower to provide a zero driving point impedance at its output. The principal function of the high-pass filter section 10 is, of course, to eliminate any signal components having frequencies below the lower limit of the pass band. In the particular embodiment illustrated, the high-pass section 10 comprises a pair of capacitors C1 and C2 and three resistors R1, R2 and R3 connected in a conventional configuration with the amplifier 20, and a feedback resistor R4.

In accordance with one important aspect of the present invention, the low-pass section of the filter comprises an RC-active filter which includes a plurality of resistors and generalized impedance converter (GIC) networks for synthesizing the frequency response of a preselected LCR filter; each GIC network includes a pair of operational amplifiers and a plurality of impedances Z1, Z2, Z3, Z4 and Z5 interconnected with said amplifiers to provide the network with a driving point impedance $$Zi = \frac{Z1\ Z3\ Z5}{Z2\ Z4}$$

in which at least one of the impedances in both the numerator and the denominator of Zi includes a film-type resistor; and at least one of the film-type resistors included in the impedances Z1, Z2, Z3, Z4 and Z5 is functionally trimmed to tune the filter. Thus, in the illustrative filter shown in FIG. 1 the low-pass section 11 includes a ladder network formed by three resistors R5, R10 and R12 and a capacitor C5 in series with each other, and two parallel resistors R6 and R11 leading to ground through corresponding GIC's 30 and 31. This ladder network simulates the LCR-passive filter shown in FIG. 2, with the resistors R5, R10 and R12, R6 and R11 taking the place of the respective inductors La, Lb, Lc, Ld and Le; the capacitor C5 taking the place of the resistor Rb; and the GIC's 30 and 31 taking the place of the capacitors Ca and Cb. The resistor Ra is considered to be infinite in the circuit of FIG. 2, and thus its capacitive counterpart would be zero and can be ignored in the RC-active circuit of FIG. 1.

The technique of using RC-active networks to simulate LCR-passive networks is not new. For example, an article by L. T. Burton et al. in *Electronic Design News*, Feb. 5, 1973, pages 68–75, entitled "Active Filter Design Using Generalized Impedance Convertors," describes the use of the "frequency dependent negative resistance" (FDNR) technique to design an RC-active filter that simulates an LCR-passive filter by making a 1/s transformation of all impedances in the LCR filter. That is, inductors in the LCR filter are replaced with resistors, resistors are replaced with capacitors, and capacitors are replaced with FDNR circuits having input impedances proportional to $1/s^2$.

In active filters that have gone into commercial production using thin or thick film techniques to form the resistors and/or the capacitors, the most popular designs are generally referred to as "Sallen and Key", "multiple feedback", "biquad" and "state variable." Although these active filters provide adequate performance characteristics, they are costly to manufacture particularly when precise tuning is required. The capacitors in film-type networks cannot be adjusted, and the resistor values can only be increased, e.g., by anodization or laser trimming. If the resistors are over-trimmed, e.g., in the process of tuning the filter, the entire network must usually be discarded because there is no practical way to reduce the value of a resistor once it has been over-trimmed.

In the present invention, the use of film-type resistors has been combined with the use of GIC's to provide an RC-active filter that greatly reduces the criticality of the trimming operation so that the filter can be quickly and efficiently tuned in mass production. This provides a high yield of filters that satisfy even stringent performance specifications, which in turn leads to a relatively low unit cost for the filters. More specifically, each GIC used in the filters of this invention has a driving point impedance $$Z_i = \frac{Z1\ Z3\ Z5}{Z2\ Z4}$$

in which at least one of the impedances in both the numerator and denominator of $Z_i$ includes a film-type resistor.

Consequently, any over-trimming of one resistor can be compensated by trimming another resistor. Thus, the trimming operations can be carried out more rapidly and efficiently because less precision is required in view of the ability to compensate for trimming errors, and the filters can be manufactured at faster production rates and, therefore, more economically with no sacrifice in quality. This is a particularly important advantage in digital telephone switching systems because a single digital switching system typically involves 2400 lines and 576 trunks, each requiring two separate filters, for a total of 5952 filters. Thus, the cost of the filter is reflected manyfold in the cost of the switching system. Indeed, the cost of the filter is probably the most significant single cost ingredient of a digital telephone switching system.

In the particular example illustrated in FIG. 1, the configuration of the two GIC's 30 and 31 are the same, although their values may be different, and corresponding elements in the two GIC's have been identified by the same reference characters with the addition of a distinguishing prime ("'") for the elements of GIC 31. The driving-point impedance for these GIC's is given by the equation $$Z_i = \frac{C3\ C4\ R9}{R7\ R8}.$$

Thus it can be seen that at least one resistor appears in both the numerator (R9) and the denominator (R7 and R8), so any error in the trimming of one of these film-type resistors can be remedied in the trimming of the other resistors. For example, if R9 is the resistor used for functional trimming and is trimmed too much, R7 and/or R8 can be trimmed to compensate for the over-trimming of R9. As a result, a large number of such filters can be precisely tuned with an extremely low reject rate due to trimming errors.

The particular configuration of the GIC's 30 and 31 utilized in the filter of FIG. 1 is well known per se. For example, it is one of the specific configurations illustrated and described in the Burton et al. article cited above. As can be seen in FIG. 1, each GIC includes a pair of differential-input operational amplifiers 32 and 33 having their inverting inputs connected to a common point between the resistor R7 and capacitor C4. Amplifier 32 has its non-inverting input connected between the resistors R8 and R9, and its output is applied between the capacitor C3 and resistor R7. Amplifier 33 receives its non-inverting input from the other side of capacitor C3 (between C3 and R6), and its output is applied between the capacitor C4 and resistor R8.

At the output of the low-pass stage of the illustrative filter, the capacitor C5 is connected across a resistor R13 and an operational amplifier 34 having a feedback resistor R14. These resistors R13 and R14 are still film-type resistors, and the capacitor C5 can be "tuned" by trimming the feedback resistor R14 to adjust the gain of the amplifier 34. Thus, a "tunable" capacitance is provided by connecting the fixed-value discrete capacitor C5 in parallel with the variable-gain amplifier 34. Any over-trimming of the feedback resistor R14 can be compensated by trimming the input resistor R13.

Thus, it will be appreciated that the tuning of the low-pass filter section 11 is effected by trimming three resistors: one in each of the GIC's 30 and 31 and one in parallel with the capacitor C5. Over-trimming of any of these three resistors can be compensated by trimming an associated resistor with a reciprocal function, thereby permitting the filter to be efficiently manufactured with a low reject rate while still meeting stringent performance specifications.

In accordance with a further aspect of the invention, all the capacitors in the RC-active filter have the same value, and are preferably discrete polycarbonate capacitors with a tolerance of ±5%. Capacitors of this type are commercially available, e.g., the B32547 and B32548 metallized polycarbonate stacked-film capacitors made by Siemens (Iselin, New Jersey). These capacitors have an excellent temperature coefficient, are stable over a long operating life, and have such a small tolerance that they provide consistent operating characteristics even in mass production. Manufacture of the filter is greatly facilitated by designing the network so that all the capacitors have the same value, with only the resistor values being adjusted to achieve the desired filter characteristic.

The final output of the low-pass section 11 of the filter is passed through a differential-input operational amplifier 35; a d-c. blocking capacitor C6; a voltage divider formed by resistors R15 and R16; and another differential-input operational amplifier 36 connected as a voltage follower and leading to the output line 14. The amplifier 35 provides the necessary gain, and this gain can be adjusted by selecting which of two resistors R17 and R18 are connected to ground at corresponding pins 37 and 38, or by connecting an external resistor across pins 39 and 40 in parallel with the feedback resistor R19 for the amplifier 35. It will be appreciated that the sockets that receive the pins 37–40 can be programmed to provide any of the different gains available from the illustrative circuit, e.g., depending on whether the filter is being used in a line or a trunk. The resistors R17 and R18 are pre-trimmed to provide the desired gain selection, and here again any over-trimming can be compensated by trimming the feedback resistor R19.

The amplifier 35 also limits the maximum peak-to-peak voltage that can be produced on the output line 14, i.e., the amplifier 35 provides a clipping action if its input signal exceeds a predetermined amplitude. The output of the amplifier 35 is then divided by the resistors R15 and R16, which determine the level of the input signal to the final amplifier 36. This amplifier 36 and its feedback resistor R20 provide a zero output impedance, and the combination of an output resistor R21 and a feedback capacitor C7 associated with the amplifier 36 isolate any capacitive loads driven by the filter output. From the resistor R21, the output signal is typically supplied via line 14 to a multiplexer and buffer.

While the invention has been described with specific reference to its utilization in a transmit filter, it should be understood that the invention is equally applicable to receive filters, i.e., for use in a receiving line of a telephone system. The same advantages described above can be realized in a receive filter, although the design characteristics would obviously be different. Of course, the design criteria for receive filters are well known in the art.

As can be seen from the foregoing detailed description, this invention provides an improved RC-active filter that can be economically manufactured at high production rates while meeting stringent performance specifications, including low passband ripple specifications. This improved filter can be quickly and efficiently tuned in mass production with a high yield of filters that satisfy these stringent performance specifications. There is no need to trim any capacitors, thereby permitting the use of discrete capacitors, and the over-trimming of any resistor can be compensated by subsequent trimming of a resistor having a reciprocal function with respect to the resistor that was over-trimmed.

I claim as my invention:

1. A voice-frequency RC-active filter comprising
a plurality of resistors and generalized impedance converter networks for synthesizing the frequency response of a preselected LC filter,
each generalized impedance converter network including a pair of operational amplifiers and a plurality of impedances Z1, Z2, Z3, Z4 and Z5 interconnected with said amplifiers to provide the network with a driving point impedance $$Zi = \frac{Z1\ Z3\ Z5}{Z2\ Z4}$$

in which at least one of the impedances in both the numerator and the denominator of Zi includes a film-type resistor,
at least one of the film-type resistors included in the impedances Z1, Z2, Z3, Z4 and Z5 being functionally trimmed to tune the filter.

2. A voice-frequency RC-active filter as set forth in claim 1 wherein said filter includes a plurality of capacitors all of which have the same value.

3. A voice-frequency RC-active filter as set forth in claim 2 wherein said capacitors are discrete polycarbonate capacitors with a capacitance tolerance of ±5%.

4. A voice-frequency RC-active filter as set forth in claim 1 which includes a plurality of said generalized impedance converter networks in a ladder network.

5. A voice-frequency RC-active filter as set forth in claim 1 wherein each generalized impedance converter network comprises a frequency dependent negative resistance network that includes a plurality of capacitors and film-type resistors comprising said impedances Z1, Z2, Z3, Z4 and Z5.

6. A voice-frequency RC-active filter as set forth in claim 1 wherein each inductor L in said preselected LC filter is represented by a resistor in said RC-active filter, and each capacitor in said preselected LC filter is represented by a generalized impedance converter network in said RC-active filter.

7. A voice-frequency RC-active filter as set forth in claim 1 wherein at least one capacitor is interconnected with said resistors and generalized impedance converter networks to synthesize the frequency response of a preselected LCR filter, and an operational amplifier is connected to said capacitor with at least one auxiliary film-type resistor for adjusting the gain of said amplifier and thereby adjusting the effective value of said capacitor, said auxiliary film-type resistor being functionally trimmed to tune the filter.

8. A method of producing a voice-frequency RC-active filter to meet a predetermined passband ripple specification, said method comprising:
interconnecting a plurality of resistors and generalized impedance converter networks for synthesizing the frequency response of a preselected LC filter, each generalized impedance converting network including a pair of operational amplifiers and a plurality of impedances Z1, Z2, Z3, Z4 and Z5 interconnected with said amplifiers to provide the network with a driving point impedance $$Zi = \frac{Z1\ Z3\ Z5}{Z2\ Z4}$$

in which at least one of the impedances in both the numerator and the denominator of Zi includes a film-type resistor,
and tuning said filter by functionally trimming at least one of the film-type resistors included in the impedance Z1, Z2, Z3, Z4 and Z5.

9. A method of producing a voice-frequency RC-active filter as set forth in claim 8 wherein at least one capacitor is interconnected with said resistors and generalized impedance converter networks to sythesize the frequency response of a preselected LCR filter, an operational amplifier is connected to said capacitor with at least one auxiliary film-type resistor for adjusting the gain of said amplifier and thereby adjusting the effective value of said capacitor, and said auxiliary film-type resistor is functionally trimmed to tune said filter.

* * * * *